United States Patent
Yun et al.

(10) Patent No.: US 10,289,485 B2
(45) Date of Patent: May 14, 2019

(54) INTEGRATED CIRCUIT

(71) Applicant: SK hynix Inc., Icheon-si Gyeonggi-do (KR)

(72) Inventors: Jae Woong Yun, Seoul (KR); Yong Mi Kim, Hwaseong-si (KR); Chang Hyun Kim, Seoul (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 0 days.

(21) Appl. No.: 15/609,524

(22) Filed: May 31, 2017

(65) Prior Publication Data

US 2018/0067801 A1  Mar. 8, 2018

(30) Foreign Application Priority Data

Sep. 5, 2016  (KR) ........................ 10-2016-0113704

(51) Int. Cl.
*H03M 13/29* (2006.01)
*G06F 11/10* (2006.01)
*H03M 13/13* (2006.01)
*G11C 29/52* (2006.01)
*G11C 29/04* (2006.01)

(52) U.S. Cl.
CPC ...... *G06F 11/1068* (2013.01); *G06F 11/1048* (2013.01); *H03M 13/13* (2013.01); *H03M 13/2906* (2013.01); *G11C 29/52* (2013.01); *G11C 2029/0411* (2013.01)

(58) Field of Classification Search
USPC .......................... 714/755, 757, 752
See application file for complete search history.

(56) References Cited

U.S. PATENT DOCUMENTS

| | | | |
|---|---|---|---|
| 9,183,082 B2* | 11/2015 | Kim ...................... | G11C 17/02 |
| 2009/0183052 A1* | 7/2009 | Kanno ................ | G06F 11/1068 714/763 |
| 2010/0275102 A1* | 10/2010 | Yagi ...................... | H04L 1/0045 714/775 |
| 2012/0321077 A1* | 12/2012 | Shiota .................. | H04L 9/0866 380/44 |
| 2013/0249720 A1* | 9/2013 | Matsuura ............ | H03M 1/1038 341/118 |

FOREIGN PATENT DOCUMENTS

KR      1020140139788 A    12/2014

* cited by examiner

*Primary Examiner* — Fritz Alphonse
(74) *Attorney, Agent, or Firm* — William Park & Associates Ltd.

(57) ABSTRACT

An integrated circuit includes a first semiconductor device suitable for outputting a first error information signal by performing a first error correction operation, and a second semiconductor device suitable for outputting a second error information signal by performing a second error correction operation. The first error correction operation and the second error correction operation are performed simultaneously, and the second error information signal is outputted from the second semiconductor device after the first error information signal is outputted from the first semiconductor device.

23 Claims, 8 Drawing Sheets

INTEGRATED CIRCUIT

CROSS-REFERENCE TO RELATED APPLICATION

The present application claims priority under 35 U.S.C. § 119(a) to Korean Patent Application No. 10-2016-0113704 filed on Sep. 5, 2016 in the Korean Intellectual Property Office, which is incorporated herein by reference in its entirety.

BACKGROUND

1. Technical Field

Embodiments of the present disclosure relate to an integrated circuit which detects error information of data stored in a plurality of semiconductor devices.

2. Related Art

Recently, signaling has been used to increase the operating speed of a semiconductor device, such as a DDR2 or DDR3, in which 4-bit or 8-bit data are inputted/outputted in each clock cycle. If a data input/output speed of the semiconductor device is increased, the probability of an error occurring during a data transmission process increases. Therefore, a separate device and method for ensuring the reliability of data transmission is demanded.

There is disclosed a method of generating each time data is transmitted, error codes for checking whether an error occurred and transmitting the error codes with the data, thereby ensuring the reliability of the data transmission. The error codes include an error detection code (EDC) capable and an error correction code (ECC). The EDC may be capable of detecting an error that has occurred. The ECC may be capable of correcting, by itself, and error that has occurred.

SUMMARY

Various embodiments are directed to an integrated circuit which simultaneously performs error correction operations for data stored in a plurality of semiconductor devices and detects error information of the data stored in the plurality of semiconductor devices.

In an embodiment, an integrated circuit may include: a first semiconductor device suitable for outputting a first error information signal by performing a first error correction operation; and a second semiconductor device suitable for outputting a second error information signal by performing a second error correction operation, wherein the first error correction operation and the second error correction operation are performed simultaneously, and the second error information signal is outputted from the second semiconductor device after the first error information signal is outputted from the first semiconductor device.

In an embodiment, an integrated circuit may include: a first semiconductor device suitable for outputting a command, a first chip select signal and a second chip select signal; a second semiconductor device suitable for performing a first error correction operation in response to the command, and outputting a first error information signal in response to the first chip select signal; and a third semiconductor device suitable for performing a second error correction operation in response to the command, and outputting a second error information signal in response to the second chip select signal, wherein the first error correction operation and the second error correction operation are performed simultaneously.

According to the embodiments, advantages are provided in that it is possible to simultaneously perform error correction operations for data stored in a plurality of semiconductor devices and detect error information of the data stored in the plurality of semiconductor devices.

DETAILED DESCRIPTION

Hereinafter, an integrated circuit will be described below with reference to the accompanying drawings through various example embodiments.

Figure 1:
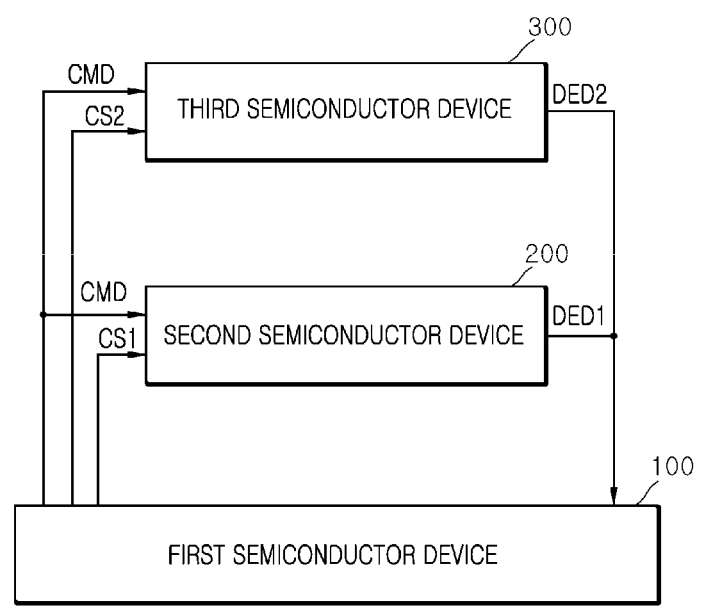
FIG. 1 is a block diagram illustrating a representation of an example configuration of an integrated circuit in accordance with an embodiment.

As shown in FIG. 1, an integrated circuit in accordance with an embodiment may include a first semiconductor device 100, a second semiconductor device 200, and a third semiconductor device 300.

The first semiconductor device 100 may output a command CMD, a first chip select signal CS1, and a second chip select signal CS2. The first semiconductor device 100 may output the second chip select signal CS2 after outputting the first chip select signal CS1. The first semiconductor device 100 may receive a first error information signal DED1 and a second error information signal DED2. The first semiconductor device 100 may receive the first error information signal DED1 to detect an error of the second semiconductor device 200. The first semiconductor device 100 may receive the second error information signal DED2 to detect an error of the third semiconductor device 300. The first error information signal DED1 may be enabled if an error occurs in at least 2 bits among the bits of first output data DOUT1<1:N> (see FIG. 2) outputted from the second semiconductor device 200. The second error information signal DED2 may be enabled if an error occurs in at least 2 bits among the bits of second output data (not shown) which is outputted from the third semiconductor device 300. The command CMD may be outputted through a line through which a command and an address are transmitted, and the command CMD may be set to include a plurality of bits, according to an embodiment.

The second semiconductor device 200 may perform a first error correction operation and output the first error information signal DED1. The second semiconductor device 200 may perform the first error correction operation in response to the command CMD. The second semiconductor device 200 may output the first error information signal DED1 in response to the first chip select signal CS1. The first error correction operation may be set as an operation in which a write operation, a read operation, and an error detection operation are sequentially performed in response to the command CMD from an exterior of the second semiconductor device 200.

The third semiconductor device 300 may perform a second error correction operation and output the second error information signal DED2. The third semiconductor device 300 may perform the second error correction operation in response to the command CMD. The third semiconductor device 300 may output the second error information signal DED2 in response to the second chip select signal CS2. The second error correction operation may be set as an operation in which a write operation, a read operation, and an error detection operation are sequentially performed in response to the command CMD from an exterior of the third semiconductor device 300. The first error correction operation and the second error correction operation may be performed simultaneously. The first error information signal DED1 and the second error information signal DED2 may be outputted through a transmission line which is shared by the first semiconductor device 100, the second semiconductor device 200 and the third semiconductor device 300. After the first error information signal DED1 is outputted from the second semiconductor device 200, the second error information signal DED2 may be outputted from the third semiconductor device 300. A period in which the first error information signal DED1 is outputted from the second semiconductor device 200 and a period in which the second error information signal DED2 is outputted from the third semiconductor device 300 may be set as different periods.

Meantime, while it is illustrated in FIG. 1 that the integrated circuit in accordance with an embodiment includes the second semiconductor device 200 and the third semiconductor device 300, it is to be noted that a plurality of semiconductor devices may be included according to an embodiment.

Figure 2:
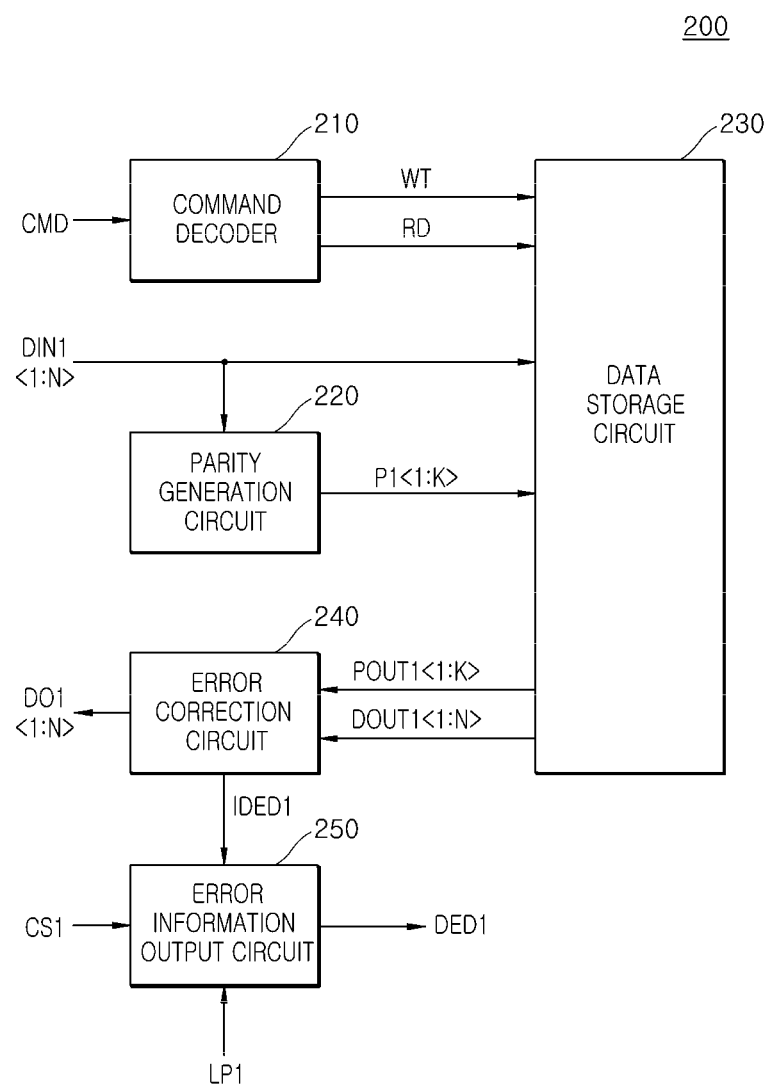
FIG. 2 is a block diagram illustrating a representation of an example internal configuration of a second semiconductor device included in the integrated circuit shown in FIG. 1.

Referring to FIG. 2, the second semiconductor device 200 in accordance with an embodiment may include a command decoder 210, a parity generation circuit 220, a data storage circuit 230, an error correction circuit 240, and an error information output circuit 250.

The command decoder 210 may generate a write signal WT and a read signal RD in response to the command CMD. The command decoder 210 may generate the write signal WT and the read signal RD which are selectively enabled, by decoding the command CMD. The command decoder 210 may generate the write signal WT and the read signal RD which are sequentially enabled, by decoding the command CMD. The write signal WT may be enabled for a write operation, and the read signal RD may be enabled for a read operation. Logic level combinations of the bits included in the command CMD, capable of enabling the write signal WT and the read signal RD, may be set in a variety of ways according to embodiments.

The parity generation circuit 220 may generate first parity P1<1:K> in response to first input data DIN1<1:N>. The parity generation circuit 220 may generate the first parity P1<1:K> by selectively performing logic calculations on the bits included in the first input data DIN1<1:N>. The first parity P1<1:K> may be generated by employing an error correction code (ECC) scheme, and the first parity P1<1:K> may include error information of the first input data DIN1<1:N>. The first input data DIN1<1:N> may be applied from the first semiconductor device 100. Alternatively, the first input data DIN1<1:N> may be generated inside the second semiconductor device 200.

The data storage circuit 230 may receive and store the first input data DIN1<1:N> and the first parity P1<1:K> in response to the write signal WT, and may output first output data DOUT1<1:N> and first output parity POUT1<1:K> in response to the read signal RD. The data storage circuit 230 may receive and store the first input data DIN1<1:N> and the first parity P1<1:K> if the write signal WT is enabled. The data storage circuit 230 may include storage circuits which store the first input data DIN1<1:N> and the first parity P1<1:K>, respectively. The data storage circuit 230 may output the first input data DIN1<1:N> stored therein as the first output data DOUT1<1:N>, and output the first parity P1<1:K> stored therein as the first output parity POUT1<1:K>, if the read signal RD is enabled.

The error correction circuit 240 may perform a first error detection operation for detecting a 2-bit error of the first output data DOUT1<1:N>. The error correction circuit 240 may detect a 2-bit error of the first output data DOUT1<1:N> based on the first output parity POUT1<1:K> and generate a first detection signal IDED1, in the error detection operation. The error correction circuit 240 may correct an error of the first output data DOUT1<1:N> based on the first output parity POUT1<1:K> and output first data DO1<1:N>, in the error detection operation. The error correction circuit 240 may correct an error of the first output data DOUT1<1:N> and output the first data DO1<1:N>, if a 2-bit error of the first output data DOUT1<1:N> occurs. The error correction circuit 240 may correct an error of the first output data DOUT1<1:N> and output the first data DO1<1:N>, if a 1-bit error of the first output data DOUT1<1:N> occurs. The error correction circuit 240 may output the first output data DOUT1<1:N> as the first data DO1<1:N>, if an error of the first output data DOUT1<1:N> does not occur. The first data DO1<1:N> may be outputted to the first semiconductor device 100. The first data DO1<1:N> may be outputted again to the data storage circuit 230 and stored in the data storage circuit 230.

The error information output circuit 250 may latch the first detection signal IDED1 in response to a first latch pulse LP1. The error information output circuit 250 may output the latched first detection signal IDED1, as the first error information signal DED1, in response to the first chip select signal CS1.

In detail, the first error correction operation described above means that a write operation, a read operation, and an error detection operation of the second semiconductor device 200 are performed sequentially. The write operation of the second semiconductor device 200 includes the operation of storing the first input data DIN1<1:N> and the first parity P1<1:K> in response to the write signal WT. The read operation of the second semiconductor device 200 includes the operation of outputting the first output data DOUT1<1:N> and the first output parity POUT1<1:K> in response to the read signal RD. The error detection operation of the second semiconductor device 200 includes the operation of detecting a 2-bit error in the first output data DOUT1<1:N> and generating the first detection signal IDED1.

Meanwhile, the third semiconductor device 300 is realized to have the same configuration and perform the same operation as the second semiconductor device 200 shown in FIG. 2. Therefore, since operations and configuration of the third semiconductor device 300 may be understood by a person skilled in the art from the configuration of the second semiconductor device 200, detailed descriptions thereof will be omitted herein.

Figure 3:
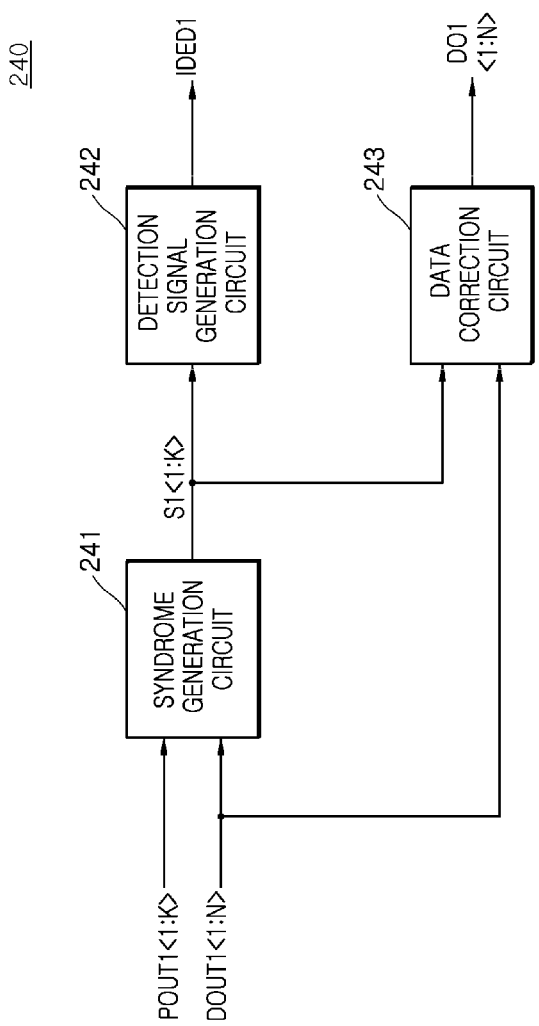
FIG. 3 is a block diagram illustrating a representation of an example internal configuration of an error correction circuit included in the second semiconductor device shown in FIG. 2.

Referring to FIG. 3, the error correction circuit 240 in accordance with an embodiment may include a syndrome generation circuit 241, a detection signal generation circuit 242, and a data correction circuit 243.

The syndrome generation circuit 241 may receive the first output data DOUT1<1:N> and the first output parity POUT1<1:K> and generate a first syndrome S1<1:K> for correcting an error of the first output data DOUT1<1:N> based on the first output parity POUT1<1:K>, where the first syndrome S1<1:K> may include information on an error included in the first output data DOUT1<1:N>. The first syndrome S1<1:K> may be generated by employing an error correction code (ECC) scheme.

The detection signal generation circuit 242 may generate the first detection signal IDED1 from the first syndrome S1<1:K>. The detection signal generation circuit 242 may generate the first detection signal IDED1 which is enabled when the first syndrome S1<1:K> indicates that an error of the first output data DOUT1<1:N> includes at least 2 bits. The first syndrome S1<1:K> may include information on the number of error bits in the first output data DOUT1<1:N>.

The data correction circuit 243 may generate the first data DO1<1:N> by correcting an error included in the first output data DOUT1<1:N>, according to the first syndrome S1<1:K>. The number of error bits of the first output data DOUT1<1:N> which may be corrected by the data correction circuit 243 may be set variously according to embodiments. The first syndrome S1<1:K> may have a logic level combination corresponding to a position of an error in the first output data DOUT1<1:N>.

Figure 4:
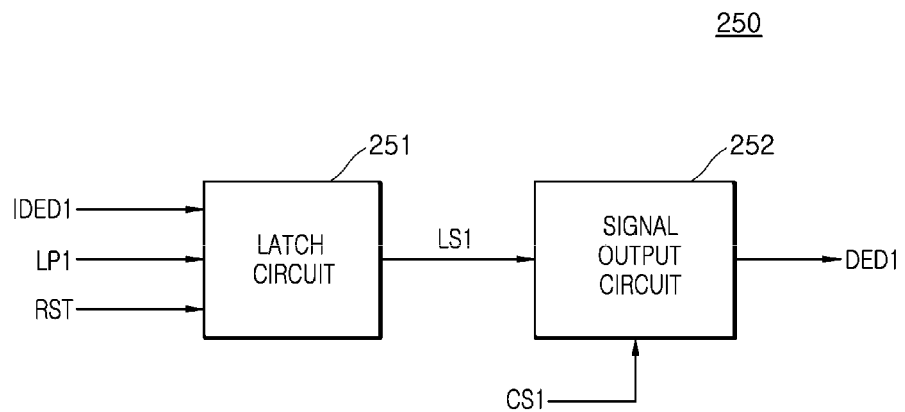
FIG. 4 is a block diagram illustrating a representation of an example internal configuration of an error information output circuit included in the second semiconductor device shown in FIG. 2.

Referring to FIG. 4, the error information output circuit 250 in accordance with an embodiment may include a latch circuit 251 and a signal output circuit 252.

The latch circuit 251 may latch the first detection signal IDED1 in response to a reset signal RST and the first latch pulse LP1. The latch circuit 251 may output the first detection signal IDED1 which is latched, as a first latch signal LS1. The latch circuit 251 may generate the first latch signal LS1 which is initialized in response to the reset signal RST. A logic level at which the first latch signal LS1 is enabled may be set variously according to embodiments. A logic level at which the first latch signal LS1 is initialized may be set variously according to embodiments. The first latch pulse LP1 may be set as a pulse signal which is generated from the read signal RD in a read operation.

The signal output circuit 252 may output the first latch signal LS1 as the first error information signal DED1 in response to the first chip select signal CS1. The signal output circuit 252 may output the first latch signal LS1 as the first error information signal DED1 if the first chip select signal CS1 is enabled. The signal output circuit 252 may be realized by an output buffer circuit which is generally known in the art.

Figure 5:
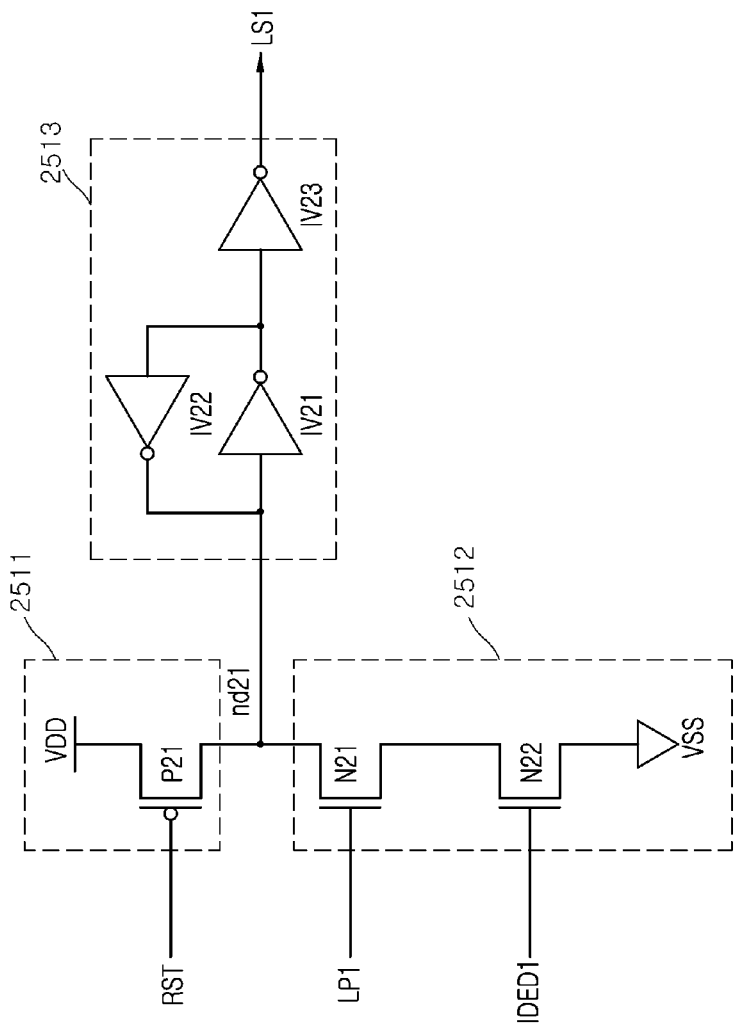
FIG. 5 is a circuit diagram illustrating a representation of an example latch circuit included in the error information output circuit shown in FIG. 4.

Referring to FIG. 5, the latch circuit 251 in accordance with an embodiment may include a first driving circuit 2511, a second driving circuit 2512, and a latch 2513.

The first driving circuit 2511 may be realized by a PMOS transistor P21 which is positioned between a power supply voltage VDD and a node nd21 and is turned on in response to the reset signal RST. The first driving circuit 2511 may pull-up drive the node nd21 in response to the reset signal RST of a logic low level. The reset signal RST may be set as a signal which is enabled to the logic low level in an operation in which the integrated circuit is initialized.

The second driving circuit 2512 may be realized by NMOS transistors N21 and N22 which are coupled in series between the node nd21 and a ground voltage VSS. The second driving circuit 2512 may pull-down drive the node nd21 when the first latch pulse LP1 is a logic high level and the first detection signal IDED1 is a logic high level.

The latch 2513 may be realized by inverters IV21, IV22 and IV23. The latch 2513 may latch the signal of the node nd21, buffer the latched signal of the node nd21, and output the first latch signal LS1.

The latch circuit 251 in accordance with an embodiment, configured as mentioned above, may generate the first latch signal LS1 which is disabled to a logic high level when the reset signal RST is enabled. The latch circuit 251 may output the first latch signal LS1 by latching the first detection signal IDED1 when the first latch pulse LP1 is inputted.

Figure 6:
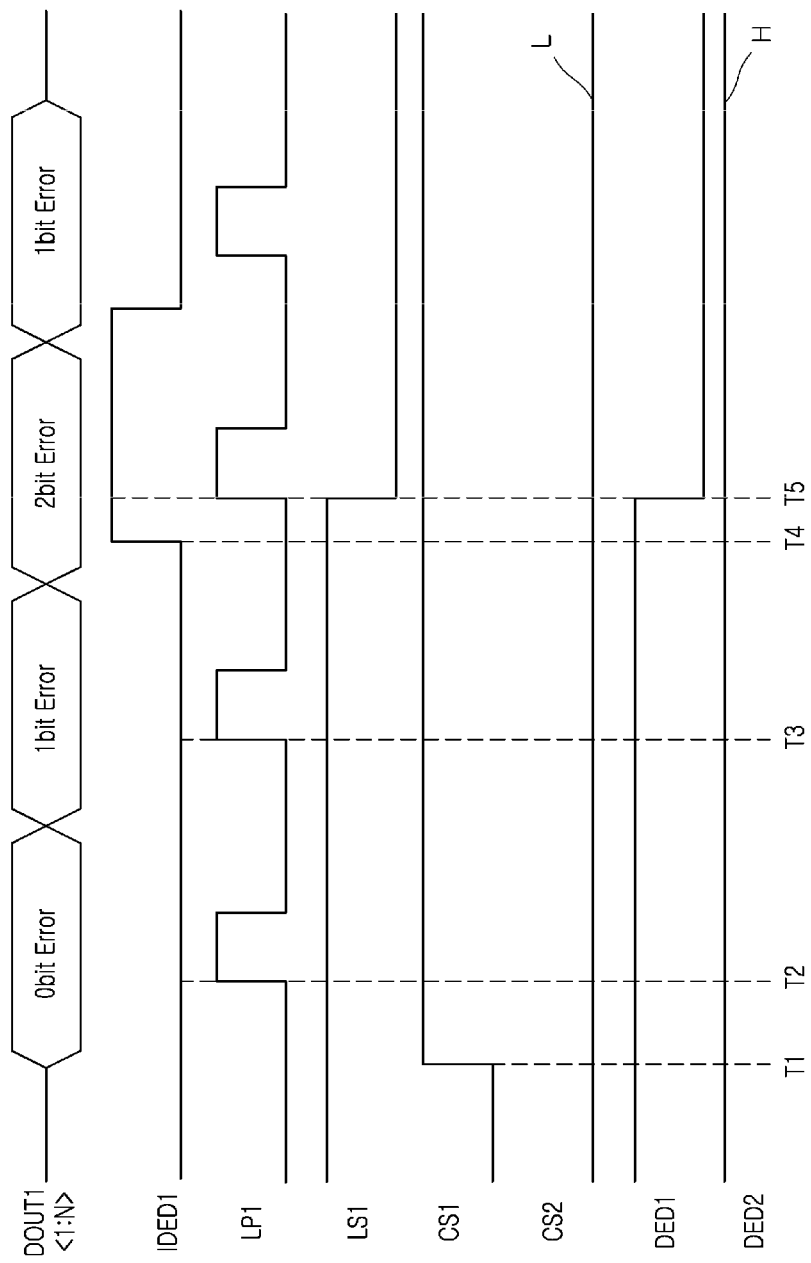
FIG. 6 is a representation of an example of a timing diagram to assist in an explanation of the operation of the integrated circuit in accordance with the embodiment.

The operation of the integrated circuit in accordance with the embodiment will be described below with reference to FIG. 6, by exemplifying operations each depending on the number of error bits of the first output data DOUT1<1:N> in the first error correction operation of the second semiconductor device 200.

At a time T1, the first semiconductor device 100 outputs the command CMD and outputs the first chip select signal CS1 of a logic high level. At this time, the second chip select signal CS2 is outputted at a logic low level.

At a time T2, the command decoder 210 of the second semiconductor device 200 decodes the command CMD and generates the write signal WT and the read signal RD.

The parity generation circuit 220 generates the first parity P1<1:K> by selectively performing logic calculations on the bits included in the first input data DIN1<1:N>.

The data storage circuit 230 receives and stores the first input data DIN1<1:N> and the first parity P1<1:K> in response to the write signal WT and the read signal RD, and the data storage circuit 230 outputs the first output data DOUT1<1:N> and the first output parity POUT1<1:K>. At this time, the first output data DOUT1<1:N> is outputted with no errors therein (0 bit Error).

The syndrome generation circuit 241 of the error correction circuit 240 receives the first output data DOUT1<1:N> and the first output parity POUT1<1:K> and generates the first syndrome S1<1:K> which may include information on an error included in the first output data DOUT1<1:N>.

The detection signal generation circuit 242 of the error correction circuit 240 generates the first detection signal IDED1 of a logic low level by detecting from the first syndrome S1<1:K> that no error has occurred in the first output data DOUT1<1:N>.

The data correction circuit 243 of the error correction circuit 240 outputs the first output data DOUT1<1:N> as the first data DO1<1:N>.

The latch circuit 251 of the error information output circuit 250 generates the first latch signal LS1 of the logic high level in response to the first detection signal IDED1 of the logic low level.

The signal output circuit 252 of the error information output circuit 250 outputs the first latch signal LS1 of the logic high level as the first error information signal DED1 in response to the first chip select signal CS1 of the logic high level.

In the meantime, the third semiconductor device 300 performs the second error correction operation during the period in which the first error correction operation of the second semiconductor device 200 is performed, and outputs the second error information signal DED2 of a logic high level in response to the second chip select signal CS2 of the logic low level.

At a time T3, the command decoder 210 of the second semiconductor device 200 decodes the command CMD and generates the write signal WT and the read signal RD.

The parity generation circuit 220 generates the first parity P1<1:K> by selectively performing logic calculations on the bits included in the first input data DIN1<1:N>.

The data storage circuit 230 receives the first input data DIN1<1:N> and the first parity P1<1:K> and stores the first input data DIN1<1:N> and the first parity P1<1:K> in response to the write signal WT and the read signal RD, and the data storage circuit outputs the first output data DOUT1<1:N> and the first output parity POUT1<1:K>. At this time, the first output data DOUT1<1:N> is outputted with a 1-bit error occurred therein (1 bit Error).

The syndrome generation circuit 241 of the error correction circuit 240 receives the first output data DOUT1<1:N> and the first output parity POUT1<1:K> and generates the first syndrome S1<1:K> which may include information on an error included in the first output data DOUT1<1:N>.

The detection signal generation circuit 242 of the error correction circuit 240 generates the first detection signal IDED1 of the logic low level by detecting from the first syndrome S1<1:K> that a 1-bit error has occurred in the first output data DOUT1<1:N>.

The data correction circuit 243 of the error correction circuit 240 corrects the error of the first output data DOUT1<1:N> and outputs the first data DO1<1:N>.

The latch circuit 251 of the error information output circuit 250 generates the first latch signal LS1 of the logic high level in response to the first detection signal IDED1 of the logic low level.

The signal output circuit 252 of the error information output circuit 250 outputs the first latch signal LS1 of the logic high level as the first error information signal DED1 in response to the first chip select signal CS1 of the logic high level.

In the meantime, the third semiconductor device 300 performs the second error correction operation during the period in which the first error correction operation of the second semiconductor device 200 is performed, and outputs the second error information signal DED2 of the logic high level in response to the second chip select signal CS2 of the logic low level.

At a time T4, the command decoder 210 of the second semiconductor device 200 decodes the command CMD and generates the write signal WT and the read signal RD.

The parity generation circuit 220 generates the first parity P1<1:K> by selectively performing logic calculations on the bits included in the first input data DIN1<1:N>.

The data storage circuit 230 receives the first input data DIN1<1:N> and the first parity P1<1:K> and stores the first input data DIN1<1:N> and the first parity P1<1:K> in response to the write signal WT and the read signal RD, and outputs the first output data DOUT1<1:N> and the first output parity POUT1<1:K>. At this time, the first output data DOUT1<1:N> is outputted with a 2-bit error therein (2 bit Error).

The syndrome generation circuit 241 of the error correction circuit 240 receives the first output data DOUT1<1:N> and the first output parity POUT1<1:K> and generates the first syndrome S1<1:K> which may include information on an error included in the first output data DOUT1<1:N>.

The detection signal generation circuit 242 of the error correction circuit 240 generates the first detection signal IDED1 of the logic high level by detecting from the first syndrome S1<1:K> that a 2-bit error has occurred in the first output data DOUT1<1:N>.

The data correction circuit 243 of the error correction circuit 240 does not correct errors in the first output data DOUT1<1:N>.

At a time T5, the latch circuit 251 of the error information output circuit 250 generates the first latch signal LS1 of a logic low level by latching the first detection signal IDED1 in response to the first latch pulse LP1.

The signal output circuit 252 of the error information output circuit 250 outputs the first latch signal LS1 as the first error information signal DED1 having a logic low level in response to the first chip select signal CS1 of the logic high level. Thereafter, the signal output circuit 252 of the error information output circuit 250 outputs the first error information signal DED1 of a logic low level during the period of the first error correction operation.

In the meantime, the third semiconductor device 300 performs the second error correction operation during the period in which the first error correction operation of the second semiconductor device 200 is performed, and outputs the second error information signal DED2 of the logic high level in response to the second chip select signal CS2 of the logic low level.

The first semiconductor device 100 receives the first error information signal DED1 of the logic low level, and detects that a 2-bit error has occurred in the first output data DOUT1<1:N> outputted from the second semiconductor device 200. Then, the third semiconductor device 300 outputs the second detection signal IDED2 which is latched, as the second error information signal DED2, in response to the second chip select signal CS2 of a logic high level. The first semiconductor device 100 receives the second error information signal DED2 outputted from the third semiconductor device 300, and detects whether an error has occurred in the second output data (not shown) outputted from the third semiconductor device 300, by detecting the logic level of the second error information signal DED2.

As is apparent from the above descriptions, in the integrated circuit in accordance with the embodiment, it is possible to perform simultaneously error correction operations for data stored in a plurality of semiconductor devices and detect error information of the data stored in the plurality of semiconductor devices.

Figure 7:
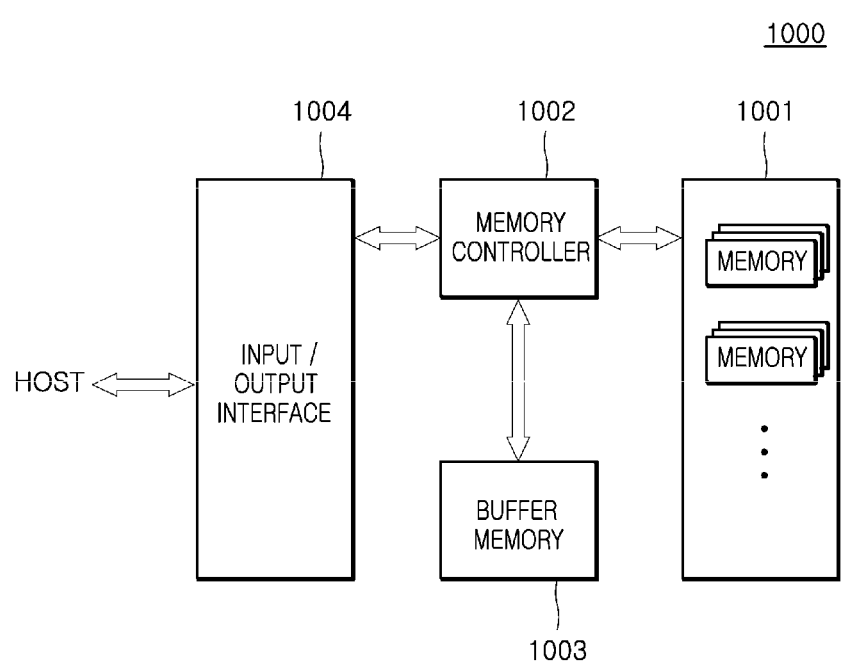
FIG. 7 is a block diagram illustrating a representation of an example configuration of an electronic system to which the integrated circuit shown in FIGS. 1 to 6 is applied.

The integrated circuit described above with reference to FIGS. 1 to 6 may be applied to an electronic system which includes a memory system, a graphic system, a computing system or a mobile system. For example, referring to FIG. 7, an electronic system 1000 in accordance with an embodiment may include a data storage 1001, a memory controller 1002, a buffer memory 1003, and an input/output interface 1004.

The data storage 1001 stores data applied from the memory controller 1002, and reads out stored data and outputs the read-out data to the memory controller 1002, according to control signals from the memory controller 1002. The data storage 1001 may include the second semiconductor device 200 and the third semiconductor device 300 shown in FIG. 1. The data storage 1001 may include a nonvolatile memory capable of not losing and continuously storing data even though power supply is interrupted. A nonvolatile memory may be realized as a flash memory such as a NOR flash memory and a NAND flash memory, a phase change random access memory (PRAM), a resistive random access memory (RRAM), a spin transfer torque random access memory (STTRAM) or a magnetic random access memory (MRAM).

The memory controller 1002 decodes commands applied through the input/output interface 1004 from an external device (a host), and controls input/output of data with respect to the data storage 1001 and the buffer memory 1003 according to decoding results. The memory controller 1002 may include the first semiconductor device 100 shown in FIG. 1. While the memory controller 1002 is illustrated as one block in FIG. 7, it is to be noted that, in the memory controller 1002, a controller for controlling a nonvolatile memory and a controller for controlling the buffer memory 1003 as a volatile memory may be independently configured.

The buffer memory 1003 may temporarily store data to be processed in the memory controller 1002, that is, data to be inputted and outputted to and from the data storage 1001. The buffer memory 1003 may store data applied from the memory controller 1002 according to a control signal. The buffer memory 1003 reads out stored data and outputs the read-out data to the memory controller 1002. The buffer memory 1003 may include a volatile memory such as a DRAM (dynamic random access memory), a mobile DRAM, and an SRAM (static random access memory).

The input/output interface 1004 provides a physical coupling between the memory controller 1002 and the external device (the host) such that the memory controller 1002 may receive control signals for input/output of data from the external device and exchange data with the external device. The input/output interface 1004 may include one among various interface protocols such as USB, MMC, PCI-E, SAS, SATA, PATA, SCSI, ESDI and IDE.

The electronic system 1000 may be used as an auxiliary memory device or an external storage device of the host. The electronic system 1000 may include a solid state disk (SSD), a USB memory (universal serial bus memory), a secure digital (SD) card, a mini-secure digital (mSD) card, a micro SD card, a secure digital high capacity (SDHC) card, a memory stick card, a smart media (SM) card, a multimedia card (MMC), an embedded MMC (eMMC), or a compact flash (CF) card.

Figure 8:
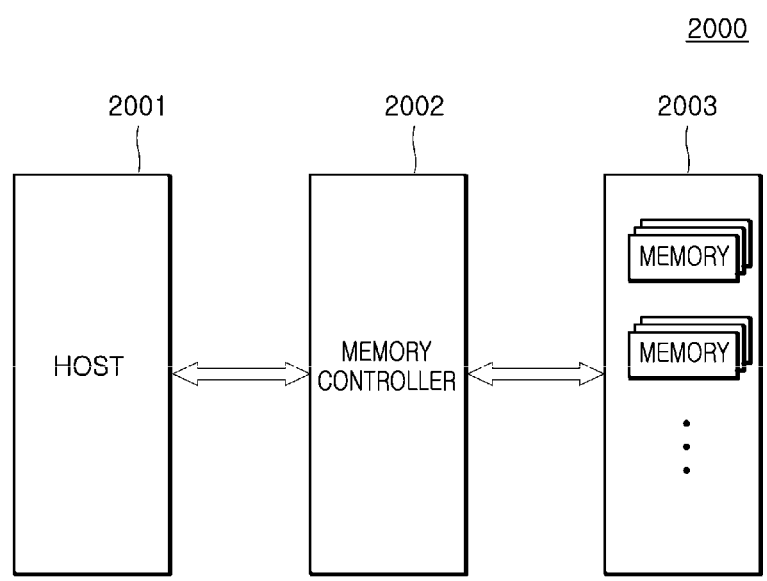
FIG. 8 is a block diagram illustrating a representation of an example configuration of an electronic system to which the integrated circuit shown in FIGS. 1 to 6 is applied.

Referring to FIG. 8, an electronic system 2000 in accordance with another embodiment may include a host 2001, a memory controller 2002, and a data storage 2003.

The host 2001 may transmit a request and data to the memory controller 2002 to access the data storage 2003. The memory controller 2002 may provide data, a data strobe, a command, an address and a clock to the data storage 2003 in response to the request, and in response to this, the data storage 2003 may perform a write or read operation. The host 2001 may transmit data to the memory controller 2002 to store the data in the data storage 2003. Also, the host 2001 may receive, through the memory controller 2002, the data outputted from the data storage 2003. The host 2001 may include a circuit which corrects an error included in data, by using an error correction code (ECC) scheme.

The memory controller 2002 may relay communication between the host 2001 and the data storage 2003. The memory controller 2002 may receive a request and data from the host 2001. In order to control operation of the data storage 2003, the memory controller 2002 may generate data, a data strobe, a command, an address and a clock, and provide them to the data storage 2003. The memory controller 2002 may provide the data outputted from the data storage 2003, to the host 2001.

The data storage 2003 may include a plurality of memories. The data storage 2003 may receive data, a data strobe, a command, an address and a clock from the memory controller 2002, and perform a write or read operation. Each of the plurality of memories included in the data storage 2003 may include a circuit which corrects an error included in data, by using the error correction code (ECC) scheme.

The error correction circuit included in the host 2001 and the error correction circuits included in the plurality of memories in the data storage 2003 may be realized to operate together or operate selectively, according to embodiments. The host 2001 and the memory controller 2002 may be realized by the same chip according to an embodiment. The memory controller 2002 and the data storage 2003 may be realized by the same chip according to an embodiment.

While various embodiments have been described above, it will be understood by those skilled in the art that the embodiments described are by way of example only. Accordingly, the integrated circuit described herein should not be limited based on the described embodiments.

What is claimed is:

1. An integrated circuit comprising:
   a first semiconductor device suitable for outputting a first error information signal by performing a first error correction operation; and
   a second semiconductor device suitable for outputting a second error information signal by performing a second error correction operation,
   wherein the first error correction operation and the second error correction operation are performed simultaneously, and the second error information signal is outputted from the second semiconductor device after the first error information signal is outputted from the first semiconductor device.

2. The integrated circuit according to claim 1, wherein the first error information signal and the second error information signal are outputted through a transmission line which is shared by the first and second semiconductor devices.

3. The integrated circuit according to claim 1, wherein, in each of the first and second error correction operations, a write operation, a read operation and an error detection operation are performed sequentially in response to a command inputted from an exterior of the first semiconductor device and the second semiconductor device.

4. The integrated circuit according to claim 1,
   wherein the first error information signal is enabled if an error occurs in at least 2 bits among bits of first output data outputted from the first semiconductor device, and
   wherein the second error information signal is enabled if an error occurs in at least 2 bits among bits of second output data outputted from the second semiconductor device.

5. The integrated circuit according to claim 1, wherein the first semiconductor device comprises:
   a first command decoder suitable for decoding a command and generating a first write signal and a first read signal;
   a first parity generation circuit suitable for generating first parity including error information of first input data;
   a first data storage circuit suitable for storing the first input data and the first parity in response to the first write signal, and generating first output data and first output parity in response to the first read signal;
   a first error correction circuit suitable for generating a first detection signal by detecting a 2-bit error of the first output data based on the first output parity in a first error detection operation, and outputting first data by correcting the error of the first output data based on the first output parity; and a first error information output circuit suitable for latching the first detection signal and outputting the latched first detection signal as the first error information signal in response to a first chip select signal.

6. The integrated circuit according to claim 5, wherein the first error correction circuit comprises:
a first syndrome generation circuit suitable for generating a first syndrome for correcting the error of the first output data, where the first syndrome is generated based on the first output parity;
a first detection signal generation circuit suitable for generating the first detection signal which is enabled if the first syndrome indicates that the error of the first output data is at least 2 bits; and
a first data correction circuit suitable for generating the first data by correcting the error of the first output data based on the first syndrome.

7. The integrated circuit according to claim 5, wherein first error information output circuit comprises:
a first latch circuit suitable for latching the first detection signal in response to a first reset signal and a first latch pulse, and outputting the latched first detection signal as a first latch signal; and
a first signal output circuit suitable for outputting the first latch signal as the first error information signal in response to the first chip select signal.

8. The integrated circuit according to claim 1, wherein the second semiconductor device comprises:
a second command decoder suitable for decoding a command and generating a second write signal and a second read signal;
a second parity generation circuit suitable for generating second parity including error information of second input data;
a second data storage circuit suitable for storing the second input data and the second parity in response to the second write signal, and generating second output data and second output parity in response to the second read signal;
a second error correction circuit suitable for generating a second detection signal by detecting a 2-bit error of the second output data based on the second output parity in a second error detection operation, and outputting second data by correcting the error of the second output data based on the second output parity; and
a second error information output circuit suitable for latching the second detection signal and outputting the latched second detection signal as the second error information signal in response to a second chip select signal.

9. The integrated circuit according to claim 8, wherein the second error correction circuit comprises:
a second syndrome generation circuit suitable for generating a second syndrome for correcting the error of the second output data, where the second syndrome is generated based on the second output parity;
a second detection signal generation circuit suitable for generating the second detection signal which is enabled if the second syndrome indicates that the error of the second output data is at least 2 bits; and
a second data correction circuit suitable for generating the second data by correcting the error of the second output data based on the second syndrome.

10. The integrated circuit according to claim 8, wherein the second error information output circuit comprises:
a second latch circuit suitable for latching the second detection signal in response to a second reset signal and a second latch pulse, and outputting the latched second detection signal as a second latch signal; and
a second signal output circuit suitable for outputting the second latch signal as the second error information signal in response to the second chip select signal.

11. An integrated circuit comprising:
a first semiconductor device suitable for outputting a command, a first chip select signal and a second chip select signal;
a second semiconductor device suitable for performing a first error correction operation in response to the command, and outputting a first error information signal in response to the first chip select signal; and
a third semiconductor device suitable for performing a second error correction operation in response to the command, and outputting a second error information signal in response to the second chip select signal,
wherein the first error correction operation and the second error correction operation are performed simultaneously.

12. The integrated circuit according to claim 11, wherein the second error information signal is outputted after the first error information signal is outputted.

13. The integrated circuit according to claim 11, wherein the first error information signal and the second error information signal are outputted through a transmission line which is shared by the first to third semiconductor devices.

14. The integrated circuit according to claim 11, wherein a period during which the first error information signal is outputted from the second semiconductor device and a period during which the second error information signal is outputted from the third semiconductor device are periods different from each other.

15. The integrated circuit according to claim 11, wherein, in each of the first and second error correction operations, a write operation, a read operation, and an error detection operation are performed sequentially in response to the command.

16. The integrated circuit according to claim 11,
wherein the first error information signal is enabled if an error occurs in at least 2 bits among bits of first output data outputted from the second semiconductor device, and
wherein the second error information signal is enabled if an error occurs in at least 2 bits among bits of second output data outputted from the third semiconductor device.

17. The integrated circuit according to claim 11, wherein the first semiconductor device receives the first error information signal and the second error information signal, and detects whether an error has occurred in each of the second semiconductor device and the third semiconductor device.

18. The integrated circuit according to claim 11, wherein the second semiconductor device comprises:
a first command decoder suitable for decoding the command and generating a first write signal and a first read signal;
a first parity generation circuit suitable for generating first parity including error information of first input data;
a first data storage circuit suitable for storing the first input data and the first parity in response to the first write signal, and generating first output data and first output parity in response to the first read signal;

a first error correction circuit suitable for generating a first detection signal by detecting a 2-bit error of the first output data based on the first output parity in a first error detection operation, and outputting first data by correcting the error of the first output data based on the first output parity; and a first error information output circuit suitable for latching the first detection signal and outputting the latched first detection signal as the first error information signal in response to the first chip select signal.

19. The integrated circuit according to claim 18, wherein the first error correction circuit comprises:

a first syndrome generation circuit suitable for generating a first syndrome for correcting the error of the first output data, where the first syndrome is generated based on the first output parity;

a first detection signal generation circuit suitable for generating the first detection signal which is enabled if the first syndrome indicates that the error of the first output data is at least 2 bits; and a first data correction circuit suitable for generating the first data by correcting the error of the first output data based on the first syndrome.

20. The integrated circuit according to claim 18, wherein the first error information output circuit comprises:

a first latch circuit suitable for latching the first detection signal in response to a first reset signal and a first latch pulse, and outputting the latched first detection signal as a first latch signal; and a first signal output circuit suitable for outputting the first latch signal as the first error information signal in response to the first chip select signal.

21. The integrated circuit according to claim 11, wherein the third semiconductor device comprises:

a second command decoder suitable for decoding the command and generating a second write signal and a second read signal;

a second parity generation circuit suitable for generating second parity including error information of second input data;

a second data storage circuit suitable for storing the second input data and the second parity in response to the second write signal, and generating second output data and second output parity in response to the second read signal;

a second error correction circuit suitable for generating a second detection signal by detecting a 2-bit error of the second output data based on the second output parity in a second error detection operation, and outputting second data by correcting the error of the second output data based on the second output parity; and a second error information output circuit suitable for latching the second detection signal and outputting the latched second detection signal as the second error information signal in response to the second chip select signal.

22. The integrated circuit according to claim 21, wherein the second error correction circuit comprises:

a second syndrome generation circuit suitable for generating a second syndrome for correcting the error of the second output data based on the second output parity;

a second detection signal generation circuit suitable for generating the second detection signal which is enabled if the second syndrome indicates that the error of the second output data is at least 2 bits; and a second data correction circuit suitable for generating the second data by correcting the error of the second output data based on the second syndrome.

23. The integrated circuit according to claim 21, wherein the second error information output circuit comprises:

a second latch circuit suitable for latching the second detection signal in response to a second reset signal and a second latch pulse, and outputting the latched second detection signal as a second latch signal; and a second signal output circuit suitable for outputting the second latch signal as the second error information signal in response to the second chip select signal.

* * * * *